(12) United States Patent
Kim et al.

(10) Patent No.: US 11,266,004 B2
(45) Date of Patent: Mar. 1, 2022

(54) PLASMA GENERATION DEVICE INCLUDING MATCHING DEVICE, AND IMPEDANCE MATCHING METHOD

(71) Applicant: KOREA ATOMIC ENERGY RESEARCH INSTITUTE, Daejeon (KR)

(72) Inventors: Sunho Kim, Sejong-si (KR); Bongki Jung, Daejeon (KR)

(73) Assignee: KOREA ATOMIC ENERGY RESEARCH INSTITUTE, Daejeon (KR)

(*) Notice: Subject to any disclaimer, the term of this patent is extended or adjusted under 35 U.S.C. 154(b) by 0 days.

(21) Appl. No.: 16/762,199

(22) PCT Filed: Nov. 5, 2018

(86) PCT No.: PCT/KR2018/013310
§ 371 (c)(1),
(2) Date: May 7, 2020

(87) PCT Pub. No.: WO2019/093728
PCT Pub. Date: May 16, 2019

(65) Prior Publication Data
US 2020/0359489 A1    Nov. 12, 2020

(30) Foreign Application Priority Data
Nov. 7, 2017 (KR) .................... 10-2017-0147521

(51) Int. Cl.
*H05H 1/46*    (2006.01)
(52) U.S. Cl.
CPC ........... *H05H 1/46* (2013.01); *H05H 2242/20* (2021.05)
(58) Field of Classification Search
None
See application file for complete search history.

(56) References Cited

U.S. PATENT DOCUMENTS

| 7,489,145 B2* | 2/2009 | Matoba ................ H01J 37/321 324/601 |
| 8,641,916 B2* | 2/2014 | Yatsuda ............ H01J 37/32091 216/67 |

(Continued)

FOREIGN PATENT DOCUMENTS

| JP | 2002-143672 A | 5/2002 |
| JP | 2002-168892 A | 6/2002 |

(Continued)

OTHER PUBLICATIONS

Korean Decision to Grant Patent dated Jul. 14, 2019, in connection with the corresponding Korean Patent Application No. 10-2017-0147521.

(Continued)

*Primary Examiner* — Amy Cohen Johnson
*Assistant Examiner* — Srinivas Sathiraju
(74) *Attorney, Agent, or Firm* — Hauptman Ham, LLP (57) ABSTRACT

The present disclosure relates to a plasma generator having a matching apparatus for matching impedances, and an impedance matching method. The plasma generator includes an RF power supply unit, a load device part including a standard load having a predetermined impedance and an antenna-plasma device configured to generate plasma, and a matching unit configured to connect the RF power supply unit to any one of the antenna-plasma device or the standard load, and match impedances of the RF power supply unit and the antenna-plasma device when the RF power supply unit is connected to the antenna-plasma device, wherein the matching unit is configured to detect a parasitic impedance according to parasitic components inside a circuit by connecting the standard load and the RF power supply unit, connect the antenna-plasma device, when the parasitic (Continued)

impedances are detected, calculate reactance required for the impedance matching, and change capacitance.

10 Claims, 5 Drawing Sheets

(56) References Cited

U.S. PATENT DOCUMENTS

| | | | | |
|---|---|---|---|---|
| 8,741,095 | B2* | 6/2014 | Koshimizu | H01J 37/32165 |
| | | | | 156/345.28 |
| 8,884,520 | B2* | 11/2014 | Kim | H05H 1/46 |
| | | | | 315/53 |
| 9,011,636 | B2* | 4/2015 | Ashida | C23C 16/50 |
| | | | | 156/345.44 |
| 9,048,518 | B2* | 6/2015 | Kudela | H05H 1/46 |
| 9,210,790 | B2* | 12/2015 | Hoffman | H01J 37/32926 |
| 9,408,664 | B2* | 8/2016 | Daw | A61B 18/16 |
| 9,530,620 | B2* | 12/2016 | Valcore, Jr. | H01J 37/32935 |
| 9,741,543 | B2* | 8/2017 | Lemson | H01J 37/32183 |
| 9,818,580 | B2* | 11/2017 | Kudela | H01J 37/32577 |
| 10,121,641 | B2* | 11/2018 | Long | H01J 37/32935 |
| 10,426,022 | B2* | 9/2019 | Kazakevich | H05H 7/02 |
| 10,573,495 | B2* | 2/2020 | Outten | H01J 37/3211 |
| 10,615,005 | B2* | 4/2020 | Nagami | H01J 37/32091 |
| 10,755,895 | B2* | 8/2020 | Marakhtanov | H01J 37/32174 |
| 10,784,083 | B2* | 9/2020 | Long | G01R 19/0061 |
| 10,886,105 | B2* | 1/2021 | Yang | H01J 37/32183 |
| 10,971,335 | B2* | 4/2021 | Kim | H01P 5/026 |
| 2002/0088400 | A1* | 7/2002 | Nakano | H01J 37/32082 |
| | | | | 118/723 E |
| 2011/0140607 | A1* | 6/2011 | Moore | H05H 1/30 |
| | | | | 315/111.21 |
| 2011/0214811 | A1* | 9/2011 | Ashida | C23C 16/50 |
| | | | | 156/345.28 |
| 2013/0193867 | A1* | 8/2013 | Van Zyl | H01J 37/32183 |
| | | | | 315/240 |
| 2013/0228550 | A1* | 9/2013 | Mori | H01J 37/32706 |
| | | | | 216/61 |
| 2014/0263181 | A1* | 9/2014 | Park | C23C 16/0245 |
| | | | | 216/68 |
| 2014/0367046 | A1* | 12/2014 | Todorow | H05H 1/46 |
| | | | | 156/345.37 |
| 2015/0075716 | A1* | 3/2015 | Ramaswamy | H01J 37/32458 |
| | | | | 156/345.28 |
| 2015/0115797 | A1* | 4/2015 | Yuzurihara | H05H 1/46 |
| | | | | 315/111.21 |
| 2016/0027617 | A1* | 1/2016 | Son | H01J 37/32935 |
| | | | | 156/345.28 |
| 2016/0141183 | A1* | 5/2016 | Mori | H03H 7/40 |
| | | | | 438/714 |
| 2016/0358755 | A1* | 12/2016 | Long | H01J 37/32935 |
| 2017/0084429 | A1* | 3/2017 | Marakhtanov | H01J 37/32183 |
| 2018/0019100 | A1* | 1/2018 | Brouk | H01J 37/32009 |
| 2019/0051497 | A1* | 2/2019 | Long | G01R 19/0084 |
| 2020/0359489 | A1* | 11/2020 | Kim | H01J 37/321 |

FOREIGN PATENT DOCUMENTS

| | | |
|---|---|---|
| JP | 2007-336148 A | 12/2007 |
| JP | 2009-246091 A | 10/2009 |
| JP | 2010-045664 A | 2/2010 |
| JP | 2011-187503 A | 9/2011 |
| JP | 2011-196901 A | 10/2011 |
| JP | 2011-202973 A | 10/2011 |
| JP | 2013-206763 A | 10/2013 |
| KR | 10-0478035 B1 | 3/2005 |
| KR | 10-2011-0100595 A | 9/2011 |
| KR | 10-1124770 B1 | 3/2012 |
| KR | 10-2014-0070068 A | 6/2014 |
| KR | 10-1570171 B1 | 11/2015 |

OTHER PUBLICATIONS

Leon et al., "RF Discharge Impedance Measurements Using a New Method to Determine the Stray Impedances," IEEE Transactions on Plasma Science, Jun. 1999, vol. 27, No. 3, pp. 759-765, cited in NPL No. 1 and 3.

International Search Report dated Feb. 19, 2019 for corresponding international application No. PCT/KR2018/013310.

Japanese Office Action dated May 7, 2021, in connection with the Japanese Patent Application No. 2020-524621.

* cited by examiner

PLASMA GENERATION DEVICE INCLUDING MATCHING DEVICE, AND IMPEDANCE MATCHING METHOD

CROSS-REFERENCE TO RELATED APPLICATION

The present application is a national stage filing under 35 U.S.C § 371 of PCT application number PCT/KR2018/013310 filed on Nov. 5, 2018 which is based upon and claims the benefit of priorities to Korean Patent Application No. 10-2017-0147521, filed on Nov. 7, 2017, in the Korean Intellectual Property Office, which are incorporated herein in their entireties by reference.

FIELD

The present disclosure relates to a plasma generator having a matching apparatus for matching impedance by connecting a radio frequency (RF) power source and an antenna-plasma device, and an impedance matching method.

BACKGROUND

In a plasma generator, a matching apparatus is used to match impedances between an RF source and a load to efficiently deliver power of the RF source to the load (antenna-plasma device). Such a matching apparatus may include a pair of capacitors that are capable of adjusting reactance according to capacitance variation to match an impedance of the RF source with an impedance of the load.

In the matching apparatus of such typical plasma generator, when a measured impedance does not match a reference matching impedance, a preset gain index within a predetermined range is multiplied by a difference between the measured impedance and the reference matching impedance, to determine capacitance of each capacitor required for matching, and an impedance that has been changed according to the determined capacitance of the capacitor matches a matching impedance. These processes may be repeated until the changed impedance matches the reference matching impedance.

On the other hand, the matching method of re-measuring an impedance using a controlled gain index, and determining whether the re-measured impedance matches a reference matching impedance has a problem in that a long matching time is required or taken due to the repetition of the matching processes. In addition, it takes a much longer time to match impedances since more matching processes are repeatedly performed when a measured impedance and a reference matching impedance have a greater difference therebetween at the time of initial matching. In addition, when a plasma load having relatively high load variability is connected, there is a problem in that a proper gain index needs to be newly found or detected or it takes a long time to measure an average impedance.

DISCLOSURE

Technical Problem

The present disclosure aims to solve the above-mentioned and other problems. One aspect of the present disclosure is to provide a plasma generator having a matching apparatus, capable of shortening a time required for impedance matching between an antenna-plasma device and an RF source, and an impedance matching method.

Technical Solution

According to an aspect of the present disclosure to achieve the above or other advantages, there is provided a plasma generator that may include a Radio Frequency (RF) power supply unit configured to supply RF power for plasma generation, a load device part including a standard load having a predetermined impedance and an antenna-plasma device configured to generate plasma according to the RF power, and a matching unit configured to connect the RF power supply unit to any one of the antenna-plasma device or the standard load, and match impedances of the RF power supply unit and the antenna-plasma device when the RF power supply unit is connected to the antenna-plasma device. The matching unit may be configured to detect a parasitic impedance according to parasitic components inside a circuit by connecting the standard load and the RF power supply unit before connecting the antenna-plasma device and the RF power supply unit, connect the antenna-plasma device, instead of the standard load, when the parasitic impedance is detected, calculate reactance required for the impedance matching based on the detected parasitic impedance, and change capacitance of capacitors provided therein according to the calculated reactance.

In one implementation, the matching unit may be configured to perform the impedance matching according to whether a calibration process for detecting the parasitic impedance is necessary when the RF power supply unit is connected to the antenna-plasma device or detect the parasitic impedance through the calibration process by connecting the RF power supply unit to the standard load, instead of the antenna-plasma device. Whether the calibration process is necessary may be determined based on whether there is a previously-detected parasitic impedance, whether a system has been initialized, or whether there is a user selection for performing the calibration process.

In one implementation, the matching unit may perform re-matching by varying the capacitance of the capacitors thereof based on a difference in impedance when a difference between an impedance measured while the antenna-plasma device is in a connected state to the RF power supply unit and a preset reference matching impedance exceeds a preset range. The matching unit may determine that the calibration process is necessary when a number of times of performing the re-matching exceeds a preset number of times and perform the calibration process.

The matching unit may detect a reflection coefficient for RF power supplied to the standard load when the standard load is connected to the RF power supply unit, and detect the parasitic impedance based on the detected reflection coefficient and an impedance of the standard load.

The matching unit may vary capacitance of the capacitors thereof to detect different reflection coefficients at least two times for the respective variations, and calculate a reflection coefficient when the standard load is connected to the RF power supply unit based on an average of the detected reflection coefficients.

According to one aspect of the present disclosure to achieve the above and other advantages, there is provided a matching method that may include connecting an RF power supply unit to a standard load having a preset impedance, instead of an antenna-plasma device, to detect a parasitic impedance according to parasitic components inside a circuit, reconnecting the RF power supply unit to the antenna-plasma device when the parasitic impedance is detected, measuring a reflection coefficient according to RF power supplied to the antenna-plasma device when the antenna-plasma device is connected, calculating a reactance value required for impedance matching based on the measured reflection coefficient and the detected parasitic impedance, and performing the impedance matching by changing capacitance of variable capacitors provided in the matching unit, so as to generate reactance according to the calculated reactance value.

In one implementation, the method may further include, prior to detecting the parasitic impedance, determining whether it is necessary to detect the parasitic impedance. The detecting of the parasitic impedance and the reconnecting of the antenna-plasma device may be performed according to a result of the determination as to whether it is necessary to detect the parasitic impedance.

In one implementation, the determination as to whether it is necessary to detect the parasitic impedance may be made according to whether there is a previously-detected parasitic impedance, whether a system has been initialized, or whether there is a user selection for performing a calibration process.

In one implementation, the performing of the impedance matching may include detecting a difference between an impedance measured when the RF power supply unit is connected to the antenna-plasma device and a preset reference matching impedance, and performing re-matching by changing the capacitance of the variable capacitors based on the detected difference in impedance when the detected difference in impedance is out of a preset range.

In one implementation, the performing of the re-matching may include re-detecting a parasitic impedance by performing the detection of the parasitic impedance again when a number of times of performing the re-matching exceeds a preset number of times, re-performing the connection to the antenna-plasma device and the measurement of the reflection coefficient, recalculating a reactance value required for the impedance matching based on the re-detected parasitic impedance, and re-performing the impedance matching by changing the capacitance of the variable capacitors provided in the matching unit, so as to generate reactance according to the recalculated reactance value.

In one implementation, the detecting of the parasitic impedance may include detecting a reflection coefficient for the standard load corresponding to RF power supplied when the standard load is connected to the RF power supply unit, and detecting the parasitic impedance based on the detected reflection coefficient for the standard load and an impedance of the standard load.

In one embodiment, the detecting of the reflection coefficient for the standard load may include varying capacitance of the variable capacitors and detecting different reflection coefficients for the respective variations a plurality of times, and calculating the reflection coefficient for the standard load based on an average of the detected reflection coefficients.

Advantageous Effects

A plasma generator and an impedance matching method according to the present disclosure will obtain effects as follows.

According to at least one of embodiments of the present disclosure, when an antenna-plasma device is connected, a required impedance can be calculated based on a parasitic impedance inside a matching apparatus and an impedance of the connected antenna-plasma device, and reactance can be adjusted by varying capacitance of capacitors according to the calculated impedance. This may result in greatly reducing a number of matching operations for performing impedance matching, thereby remarkably shortening a time spent for the impedance matching.

DETAILED DESCRIPTION OF THE DISCLOSURE

It is noted that the technical terms used herein are used only to describe specific embodiments and are not intended to limit the invention. A singular representation may include a plural representation unless it represents a definitely different meaning from the context. In this specification, the terms "comprising" and "including" should not be construed to necessarily include all of the elements or steps disclosed herein, and should be construed not to include some of the elements or steps thereof, or should be construed to further include additional elements or steps.

In general, a suffix such as 'unit' referring to an element or component used herein is merely intended to facilitate description of the specification or used together with a suffix such as 'device', and the suffix itself is not intended to give any special meaning or function.

In describing the present disclosure, if a detailed explanation for a related known function or construction is considered to unnecessarily divert the gist of the present disclosure, such explanation has been omitted but would be understood by those skilled in the art.

Hereinafter, exemplary embodiments disclosed herein will be described in detail with reference to the accompanying drawings.

First, the principle of the present disclosure will be briefly described. The present disclosure is configured to calculate a necessary impedance component according to an antenna-plasma device to be connected, and vary capacitance of each capacitor to generate reactance according to the calculated impedance component, thereby performing impedance matching according to the connected antenna-plasma device even without performing a plurality of matching processes.

In order to accurately calculate the necessary impedance component when the antenna-plasma device is connected, a parasitic impedance component included in a circuit element constituting the matching unit must be known. If a parasitic impedance component is not known, this is the same as the case where matching is simply made between the antenna-plasma device and an RF source, and accordingly an impedance error may be continuously caused due to the parasitic impedance component.

Such parasitic impedance may be generated by various circuit elements provided in the matching unit. For example, FIG. 1 is a conceptual diagram illustrating an example of a plasma generator having a typical matching unit including a pair of capacitors.

Figure 1:
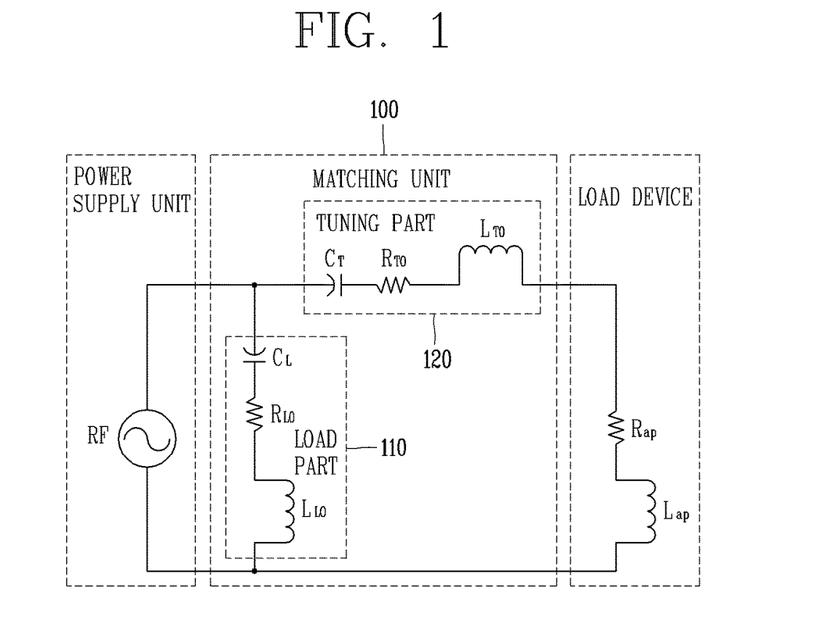
FIG. 1 is a conceptual diagram illustrating an example of a plasma generator having a matching unit including a pair of capacitors.

Referring to FIG. 1, the typical matching unit 100 basically includes two capacitors $C_L$ and $C_T$. The capacitors $C_L$ and $C_T$ may be variable capacitors each of which includes a stepping motor to vary capacitance.

One (e.g., $C_T$) of the capacitors includes a parasitic resistor $R_{T0}$ and a parasitic inductance component $L_{T0}$ by a conductor for connecting to an RF source, that is, an RF power source and a ground. Hereinafter, the capacitor $C_T$, the parasitic resistor $R_{T0}$, and the parasitic inductance component $L_{T0}$ will be referred to as a tuning part 120. The other capacitor $C_L$ includes a parasitic resistor $R_{L0}$ and a parasitic inductance component $L_{L0}$ by a conductor for connecting to an antenna-plasma device which is a load. Hereinafter, the capacitor $C_L$, the parasitic resistor Rio, and the parasitic inductance component Leo will be referred to as a load part 110. That is, each capacitor may include the parasitic resistor $R_{L0}$, $R_{T0}$ and the parasitic inductance component $L_{L0}$, $L_{T0}$ or may include an additional inductor to adjust a range of matching.

Accordingly, in the present disclosure, instead of an antenna-plasma device, the matching unit connects a standard load having an impedance value known in advance, that is, a preset impedance value, and calculates a parasitic impedance according to the parasitic resistor and the parasitic inductance component based on a reflection coefficient measured according to the connected standard load. When the antenna-plasma device is connected, the matching unit accurately calculates a required reactance by calculating an accurate magnitude of a required impedance based on the calculated parasitic impedance. Then, the matching unit varies capacitance of the capacitors $C_L$ and $C_T$ according to the calculated reactance. This results in reducing a number of matching performed, and shortening a time spent for the matching.

Figure 2:
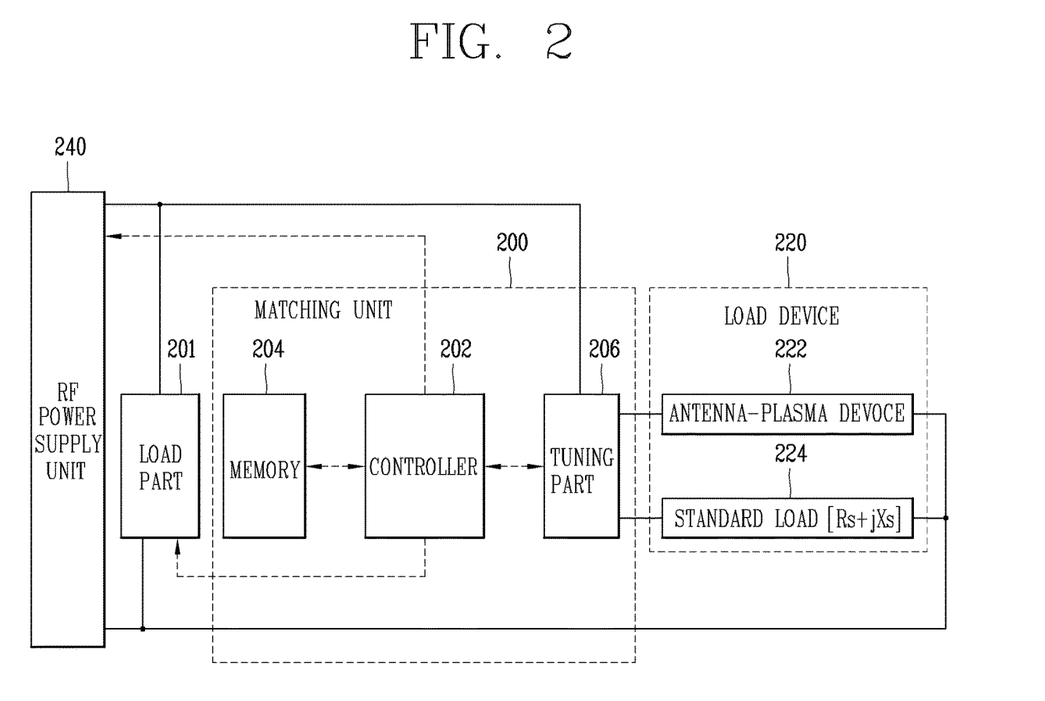
FIG. 2 is a conceptual diagram illustrating an example of a plasma generator including a matching unit in accordance with one embodiment of the present disclosure.

FIG. 2 is a conceptual diagram illustrating an example of a plasma generator including a matching unit 200 in accordance with one embodiment of the present disclosure.

Referring to FIG. 2, a plasma generator including a matching unit 200 according to an embodiment of the present disclosure may include an RF power supply unit 240, the matching unit 200, and a load device 220.

The matching unit 200 may include a controller 202, and a load part 201, a tuning part 206, and a memory 204 which are controlled by the controller 202. Here, the tuning part 206 may include a variable capacitor $C_T$, a parasitic resistor $R_{T0}$, and a parasitic inductance component $L_{T0}$, and the load part 201 may include a variable capacitor $C_L$, a parasitic resistor $R_{L0}$, and a parasitic inductance component $L_{L0}$.

On the other hand, the load device 220 may include a standard load 224 ($R_s+jX_s$) for calculating a parasitic impedance component, in addition to an antenna-plasma device 222 ($R_{ap}+jX_{ap}$) for generating plasma. The matching unit 200 may be connected to one of the antenna-plasma device 222 and the standard load 224 under the control of the controller 202.

Meanwhile, when the standard load 224 is connected to the matching unit 200, the controller 202 may vary or change capacitance of the first variable capacitor $C_T$ and the second variable capacitor $C_L$. The controller 202 may then measure reflection coefficients according to the changed different capacitance. Values of the parasitic resistors Rio and $R_{T0}$ and the parasitic inductance components Leo and $L_{T0}$ may be obtained based on the measured reflection coefficients, a difference in reactance according to the changed capacitance of the capacitors, and a preset impedance value of the standard load. The obtained values of the parasitic components $R_{L0}$, $R_{T0}$, $L_{L0}$, and $L_{T0}$ may be stored in the memory 204. In addition, the values of the parasitic components may be repeatedly used since the values do not change unless geometric structure and arrangement characteristics of conductors within a circuit vary. In the following description, a process of calculating the values of the parasitic components $R_{L0}$, $R_{T0}$, $L_{L0}$, $L_{T0}$ will be referred to as a 'calibration process'.

Meanwhile, when the values of the parasitic components $R_{L0}$, $R_{T0}$, $L_{L0}$, and $L_{T0}$ are calculated, the controller 202 may control the matching unit 200 to be connected to the antenna-plasma device 222. When the antenna-plasma device 222 is connected, the controller 202 may calculate an impedance component required for impedance matching based on the values of the parasitic components calculated through the calibration process. And a magnitude of reactance may be determined based on the calculated impedance component.

The controller 202 may control the tuning part 206 and the load part 201 to vary or change the capacitance of each capacitor $C_L$ and $C_T$ of the tuning part 206 and the load part 201 according to the determined magnitude of the reactance. Therefore, in the present disclosure, since the capacitance of the capacitors $C_L$ and $C_T$ is immediately changed according to the impedance value required when the antenna-plasma device 222 is connected, an impedance that matches a reference matching impedance can be generated, preferably, even by a one-time matching operation.

Figure 3:
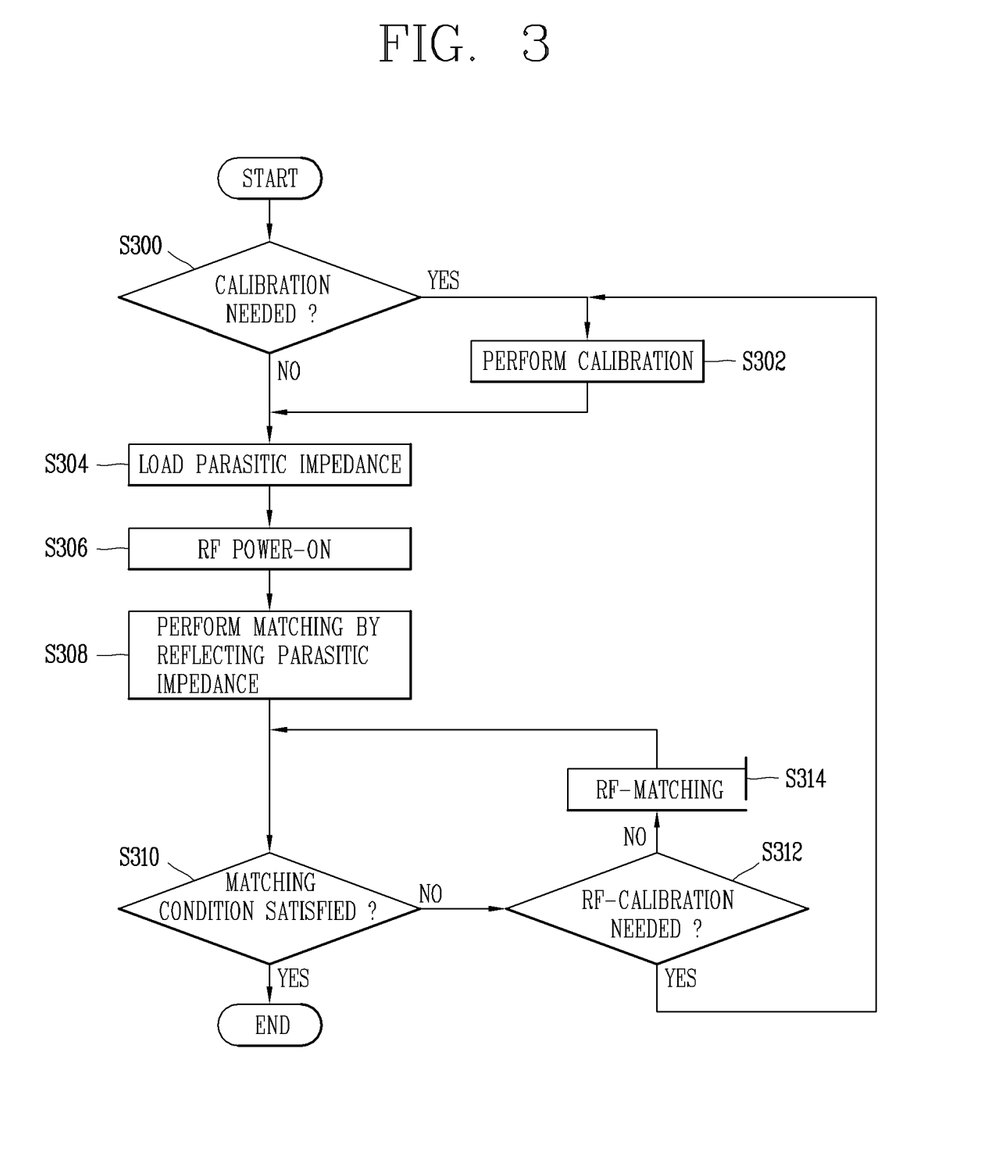
FIG. 3 is a flowchart illustrating a matching procedure including a calibration process of detecting a parasitic impedance value in a matching unit in accordance with one embodiment of the present disclosure.

FIG. 3 is a flowchart illustrating a matching operation including a calibration process of detecting a parasitic impedance value in a matching unit in accordance with one embodiment of the present disclosure.

The controller 202 of the matching unit 200 according to the embodiment of the present disclosure may first determine whether or not to perform a calibration process (S300). Whether to perform such calibration process may be determined according to a preset calibration execution condition.

For example, the controller 202 may determine whether the calibration process is necessary according to a result of checking whether there are values of parasitic components stored in the memory 204. That is, when the plasma generator including the matching unit 200 according to the embodiment of the present disclosure or the matching unit 200 has been initially driven, a system of the plasma generator or the matching unit has been initialized, or the values of the parasitic components have been deleted due to other causes, the controller 202 may determine that a calibration process for calculating values of parasitic components is necessary. Alternatively, when the user directly selects re-execution of the calibration process, the calibration process may be performed.

On the other hand, even if there are previously stored values of parasitic components, the controller 202 may determine that the calibration process is necessary. For example, the controller 202 may determine that recalibration is necessary when re-matching that is performed because a measured impedance does not match a reference matching impedance is performed a preset number of times.

When it is determined in step S300 that the calibration is required, the controller 202 may perform the calibration process (S302). When the calibration process is performed, the controller 202 may control the matching unit 200 to be connected to the standard load 224 instead of the antenna-plasma device 222. The controller 202 may vary or change the capacitance of the capacitors belonging to the tuning part 206 and the load part 201 to different arbitrary values, and calculate values of the parasitic components based on the reflection coefficients measured according to each changed capacitance of the capacitors. When the calibration process is completed, the controller 202 may control the matching unit 200 to be connected to the antenna-plasma device 222 again. That is, the controller 202 may control the matching unit 200 to be connected to the antenna-plasma device 222 unless the calibration process is performed. This calibration process will be described in more detail with reference to FIG. 4.

On the other hand, when it is determined in step S300 that the calibration is not necessary or the calibration has been performed in step S302, the controller 202 may load the values of the parasitic components stored in the memory 204 (S304).

On the other hand, when the values of the parasitic components are loaded, the controller 202 may control the RF power supply unit 240 to be turned on (S306). Accordingly, power may be supplied from the RF power supply unit 240. Accordingly, the reflection coefficient according to the applied power and the impedance of the antenna-plasma device 222 may be measured. In this case, the step S306 may be a step of maintaining the ON state of the RF power supply unit 240 when the RF power supply unit 240 is in the ON state.

Then, the controller 202 may calculate a required impedance based on the measured reflection coefficient, and determine a magnitude of a reactance based on the calculated impedance. The capacitance of the capacitors CL and CT may be changed by controlling stepping motors of the capacitors CL and CT according to the determined magnitude of the reactance. Matching between an impedance measured based on the changed capacitance of the capacitors CL and CT and a reference matching impedance is performed (S308).

On the other hand, when the matching is performed in step S308, the controller 202 may determine whether a matching condition has been satisfied (S310). The determination as to whether the matching condition has been satisfied may be a process of determining whether a difference between the impedance measured according to the changed capacitance of the capacitors CL and CT and the reference matching impedance is smaller than or equal to a preset reference value. That is, when a difference between the measured impedance and the reference matching impedance is within a preset range, the controller 202 may determine that the matching has been made. However, when the difference between the measured impedance and the reference matching impedance is out of the preset range, the controller 202 may determine that the matching has failed.

On the other hand, when it is determined in step S310 that the matching has failed, the controller 202 may determine whether recalibration is necessary (S312). For example, the controller 202 may determine that the recalibration is necessary when the matching has failed for a preset number of times. However, when it is determined in step S312 that the recalibration is not necessary, the controller 202 may perform re-matching (S314).

The re-matching of step S314 may include a process of recalculating a required impedance according to a difference between a currently-measured impedance and the reference matching impedance. That is, in step S314, the controller 202 may recalculate the impedance required for impedance matching based on a difference between currently-calculated impedances and pre-stored parasitic component values, and change or vary the capacitance of the capacitors again according to the re-calculated required impedance value.

On the other hand, when it is determined in step S312 that the recalibration is necessary, the controller 202 may proceed to step S302 again. Then, the controller 202 may re-perform the calibration process to update values of parasitic components calculated as a result of the calibration process. The controller 202 may perform the process from step S304 to step S310 again based on the updated values of the parasitic components.

Meanwhile, when it is determined in step S300 of FIG. 3 that the calibration is necessary, the controller 202 of the matching unit 200 may proceed to step S302 to perform the calibration process. The calibration process, as aforementioned, is to detect the parasitic impedance according to the parasitic components within the matching unit 200. And the controller 202 of the matching unit 200 may determine the capacitance of the capacitors required for impedance matching based on the parasitic impedance, when the antenna-plasma device 222 is connected as a load.

Figure 4:
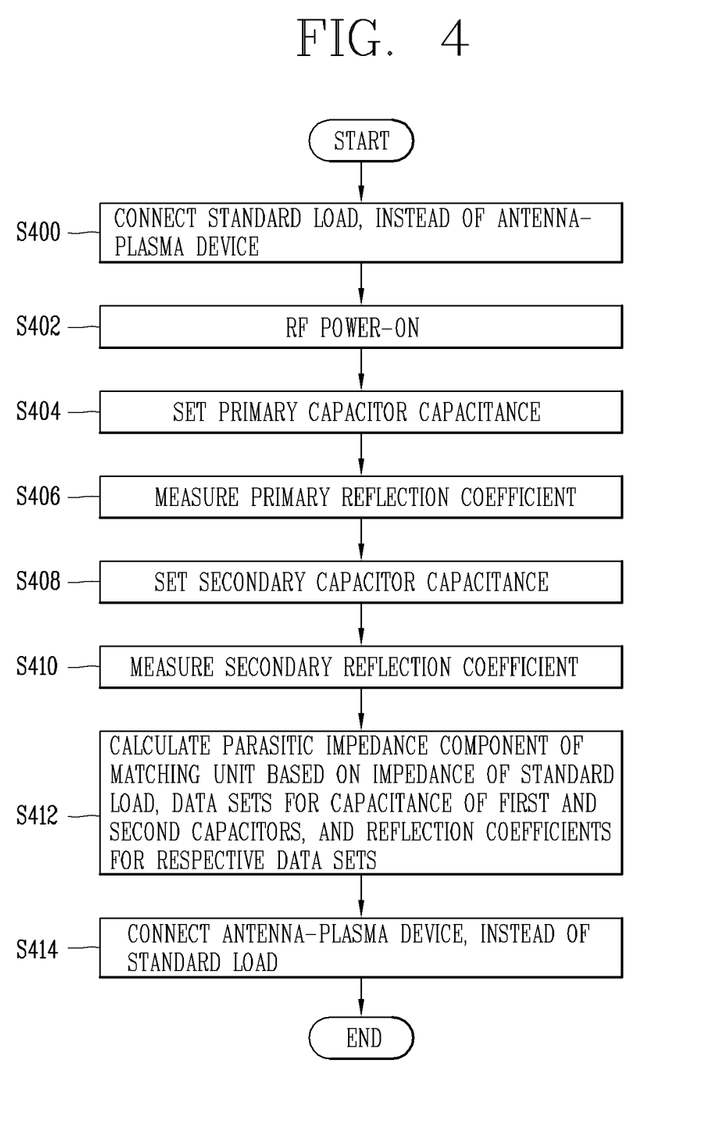
FIG. 4 is a flowchart illustrating in more detail a calibration process of detecting a parasitic impedance value in a matching unit in accordance with one embodiment of the present disclosure.

FIG. 4 is a detailed flowchart illustrating the calibration process for detecting the parasitic impedance value in the matching unit 200 according to the embodiment of the present disclosure.

Referring to FIG. 4, when the calibration process is performed, the controller 202 may control the matching unit 200 to be connected to the standard load 224 having an impedance known in advance, instead of the currently-connected antenna-plasma device 222 (S400). In addition, the controller 202 may control the RF power supply unit 240 to be turned on or maintain an ON-state of the RF power supply unit 240 when the RF power supply unit 240 is in the ON-state (S402). The controller 202 may then calculate the parasitic impedance based on a reflection coefficient measured when the standard load 224 is connected.

To this end, the controller 202 may first set capacitance of each connected capacitor $C_L$ and $C_T$ to an arbitrary first value (S404). And the controller 202 may measure a reflection coefficient $\Gamma_1$ according to the currently-connected standard load 224 ($R_s+jX_s$) based on the capacitance of the capacitors set to the first value (S406). The controller 202 may then set the capacitance of each capacitor $C_L$ and $C_T$ to an arbitrary second value (S408), and measure a reflection coefficient $\Gamma_2$ according to the currently-connected standard load 224 ($R_s+jX_s$) based on the capacitance of the capacitors set to the second value (S410). The controller 202 may store the impedance of the standard load, data sets of the capacitance (first value, second value) set for the capacitors (i.e., ($C_L$, $C_T$)$_1$: data set according to the first value, ($C_L$, $C_T$)$_2$: data set according to the second value), and the reflection coefficients $\Gamma_2$ $\Gamma$1 and $\Gamma_2$ $\Gamma$2 measured according to each of the data sets.

Meanwhile, when the data sets according to the capacitance of the capacitors, the impedance of the standard load, and the reflection coefficients are stored, the controller 202 may calculate a parasitic impedance of the parasitic components within the matching unit 200 based on the stored values and store the calculated parasitic impedance (S412).

For example, in case of the data set ((CL, CT) i=1, 2) according to the capacitance of the capacitors for impedance matching, if an impedance corresponding to a measured reflection coefficient $\Gamma_{Di}$ is $Z_{Di}$, this should be the same as a total impedance $Z_{ti}$. That is, it may be expressed as Equation 1 below.

$$Z_{Di}(\Gamma_{Di}) = R_{Di} + jX_{Di} = Z_{ti}, i = 1,2 \qquad [\text{Equation 1}]$$

where R denotes resistance, X denotes reactance, and j denotes complex.

Here, if an impedance on a circuit line of a load capacitor is $Z_{Li} = R_L + jX_{Li}$ and an impedance on a circuit line of a tuning capacitor is $Z_{Ti} = R_T + jX_{Ti}$, the total impedance $Z_{ti}$ may be expressed as in Equation 2 below.

$$Z_{ti} = \frac{Z_{Li}Z_{Ti}}{Z_{Li}+Z_{Ti}} = \frac{(R_L R_T - X_{Li}X_{Ti}) + j(R_T X_{Li} + R_L X_{Ti})}{(R_L + R_T) + j(X_{Li} + X_{Ti})}, \quad i = 1, 2 \qquad [\text{Equation 2}]$$

where $R_L$ denotes parasitic resistance $R_{L0}$ of the load part 110, and $R_T$ denotes the sum of the parasitic resistance Rio of the tuning part 120 and resistance $R_S$ of the standard load. $X_{Li}$ denotes the sum of inductive inductance $X_{L0}$ calculated from the parasitic inductance $L_{L0}$ of the load part 110 and capacitive reactance $X_{LCi}$ of a capacitor. $X_{Ti}$ denotes the sum of inductive inductance $X_{T0}$ calculated from the parasitic inductance $L_{L0}$ of the tuning part 120, capacitive reactance $X_{TCi}$ of a capacitor, and reactance $X_S$ of the standard load. This is summarized in Equation 3.

$$R_L = R_{L0}$$

$$R_T = R_{T0} + R_S$$

$$X_{Li} = X_{L0} X_{LCi}$$

$$X_{Ti} = X_{T0} X_{TCi} + X_S \qquad [\text{Equation 3}]$$

On the other hand, since a difference in magnitude of reactance between two data sets can be known from the capacitance of the capacitors of the two data sets, the following equation as in Equation 4 is established.

$$X_{L2} - X_{L1} = \Delta X_L$$

$$X_{T2} - X_{T1} = \Delta X_T \qquad [\text{Equation 4}]$$

Therefore, parasitic impedance values $R_{L0}$, $R_{T0}$, $X_{L0}$, $X_{T0}$ to be obtained through the calibration process may be obtained by using Equation 3 based on those values $R_L$, $R_T$, $X_{Li}$ and $X_{Ti}$ which are calculated by combining Equations 1, 2, and 4.

Meanwhile, when the values of the parasitic impedances are calculated and stored in step S412, the controller 202 may control the matching unit 200 to be connected to the antenna-plasma device 222 instead of the currently-connected standard load 224 (S414). When the antenna-plasma device 222 is connected again, the calibration process may be completed.

Meanwhile, when the calibration process of FIG. 4 is completed, the controller 202 may proceed to step S304 of FIG. 3, to load the currently-stored parasitic impedance values. The controller 202 may then proceed to steps S306 and S308 of FIG. 3, to perform impedance matching reflecting the currently-loaded parasitic impedance values.

Here, the step S308 of FIG. 3 may include a process of calculating a required reactance value based on parasitic impedance components, so that an impedance generated when the antenna-plasma device 222 is connected to the matching unit 200 can match a reference matching impedance value. For example, the step S308 of FIG. 3 may include the following process.

First, when the matching unit 200 is connected to the antenna-plasma device 222 instead of the standard load 224 and the RF power supply unit 240 is turned on, RF power may be incident to generate plasma. And a new impedance $Z_{ap} = R_{ap} + jX_{ap}$ according to the connection of the antenna-plasma device 222 may be generated. Here, the capacitance of the capacitors required for matching according to the connection of the antenna-plasma device 222 (hereinafter, referred to as matching capacitance) may be calculated based on the new impedance $Z_{ap}$.

To this end, the controller 202 may first measure the reflection coefficient as the antenna-plasma device 222 is connected. On the other hand, since an impedance to be obtained from the measured reflection coefficient and a total impedance are the same, Equation 4 may be established. And impedance components $R_T$ and $X_T$ of the tuning part 206 having the impedance $Z_{ap}$ may be obtained using the following Equation 5.

$$Z_D(\Gamma_D) = \qquad [\text{Equation 5}]$$
$$R_D + jX_D = \frac{Z_L Z_T}{Z_L + Z_T} = \frac{(R_L R_T - X_L X_T) + j(R_T X_L + R_L X_T)}{(R_L + R_T) + j(X_L + X_T)}$$

where $R_D$ and $X_D$ are obtained from the measured reflection coefficient $\Gamma_D$. $R_L$ denotes the parasitic resistance $R_{L0}$ of the load part 110. $X_L$ denotes a value obtained by adding inductive reactance $X_{L0}$ of the parasitic inductance of the load part 110 and capacitive reactance $X_{LC}$ of the capacitor of the load part at the time point when the antenna-plasma load is connected. $R_T$ denotes the sum of the parasitic resistance $R_{T0}$ of the tuning part 120 and the resistance $R_{ap}$ of the antenna-plasma load. $X_T$ denotes the sum of inductive reactance $X_{T0}$ of the parasitic inductance of the tuning part 120, capacitive reactance $X_{TC}$ of the capacitor of the tuning part 120 at the time point when the antenna-plasma load is connected, and antenna-plasma reactance $X_{ap}$. This is summarized as in Equation 6.

$$R_L = R_{L0}$$

$$R_T = R_{T0} + R_{ap}$$

$$X_L = X_{L0} + X_{LC}$$

$$X_T = X_{T0} + X_{TC} + X_{ap} \qquad [\text{Equation 6}]$$

The values $R_T$ and $X_T$ in Equation 5 may be expressed as in Equation 7, and accordingly the impedance $Z_{ap} = R_{ap} + jX_{ap}$ in response to the connection of the antenna-plasma device 222 can be calculated by Equation 6.

$$[\text{Equation 7}]$$
$$R_T = \frac{R_D(X_L^2 - R_D R_L) - R_L(X_D^2 - R_D R_L)}{(R_D - R_L)^2 + (X_D - X_L)^2}$$

$$X_T = \frac{(R_L^2 - 2X_D X_L + X_L^2)}{2(X_D - X_L)}$$

$$\left[1 - \left\{1 + \frac{4(X_L - X_D)(X_D(R_L + R_T) - X_L(R_T^2 - X_L X_D))}{(R_L^2 - 2X_D X_L + X_L^2)}\right\}^{\frac{1}{2}}\right]$$

On the other hand, matching capacitance (capacitance required for matching) should satisfy the following Equation 8 since a total impedance has to be the same as a characteristic impedance (typically 50 Ohm) of a transmission line.

[Equation 8]

$$Z_0 = \frac{Z_L' Z_T'}{Z_L' + Z_T'} = \frac{(R_L R_T - X_L' X_T') + j(R_T X_L' + R_L X_T')}{(R_L + R_T) + j(X_L' + X_T')}$$

where $Z_0$ impedance, and $X_T'$ and $X_L'$ denote new reactances according to the capacitance of the capacitors changed for matching. $R_L$, $R_T$, $X_T'$ and $X_L'$ are obtained by changing only the capacitance of the capacitors of the matching unit for performing matching. Therefore, they should satisfy the following Equation 9 similar to Equation 6.

$R_L = R_{L0}$ $R_T = R_{T0} + R_{ap}$ $X_L' = X_{L0} + X_{LC}'$ $X_T' = X_{T0} + X_{TC}' + X_{ap}$ [Equation 9]

$X_T'$ and $X_L'$ may be calculated by the following Equation 10, which can be derived from Equation 8.

$$X_T' = \frac{-(R_L^2 + X_L'^2) + \{(R_L^2 + X_L'^2) - 4R_T^2 X_L'^2\}^{1/2}}{2X_L'}$$ [Equation 10]

$$X_L' = -\left[(Z_0 - R_L)\left\{(R_L - Z_0) + \frac{1}{(Z_0 - R_T)}\right\}\right]^{1/2}$$

Finally, variable capacitances $\Delta X_L$, $\Delta X_T$ of the capacitors required for impedance matching when the antenna-plasma device 222 is connected can be obtained by Equation 11 in which reactance for a capacitor capacitance prior to matching is subtracted from the reactance obtained by Equation 10.

$\Delta X_L = X_L' - X_L$ $\Delta X_T = X_T' - X_T$ [Equation 11]

Meanwhile, the foregoing description has been given of the detailed embodiments of the present disclosure, but various modifications may be made without departing from the scope of the present disclosure. In particular, in the embodiment of the present disclosure, the reflection coefficients are measured by varying changing the capacitance of the capacitors to the first value and the second value, respectively, during the calibration process and the parasitic impedance is calculated based on the measured reflection coefficients. However, the present disclosure is not limited to this. That is, the reflection coefficients may be measured by varying or changing the capacitance of the capacitors to more many arbitrary values, and the parasitic impedance may be calculated based on the measured reflection coefficients. When the reflection coefficients are measured more frequently, more accurate parasitic impedance component values can be calculated.

In addition to the illustrative standard matching apparatus, the present disclosure may implement an automatic matching apparatus by using the same methodology with respect to other general matching apparatuses such as an alternative matching apparatus (a type moved to a position of a direction coupling measuring device of the tuning part), a pie network type matching apparatus, a double (triple) stub matching apparatus for nuclear fusion, and the like.

In the above description, the configuration of calculating the parasitic impedance component values using only reflection coefficients measured from the standard load and calculating the capacitance of the capacitors required for matching based on the calculated parasitic impedance component values has been described. However, the final matching may be performed, of course, in a different manner. For example, the final matching may be achieved by determining a capacitance of two capacitors in a manner that the two capacitors have a minimum reflection coefficient in an alternating manner, and varying or changing the capacitance of the capacitors by operating a stepping motor of each capacitor.

Figure 5:
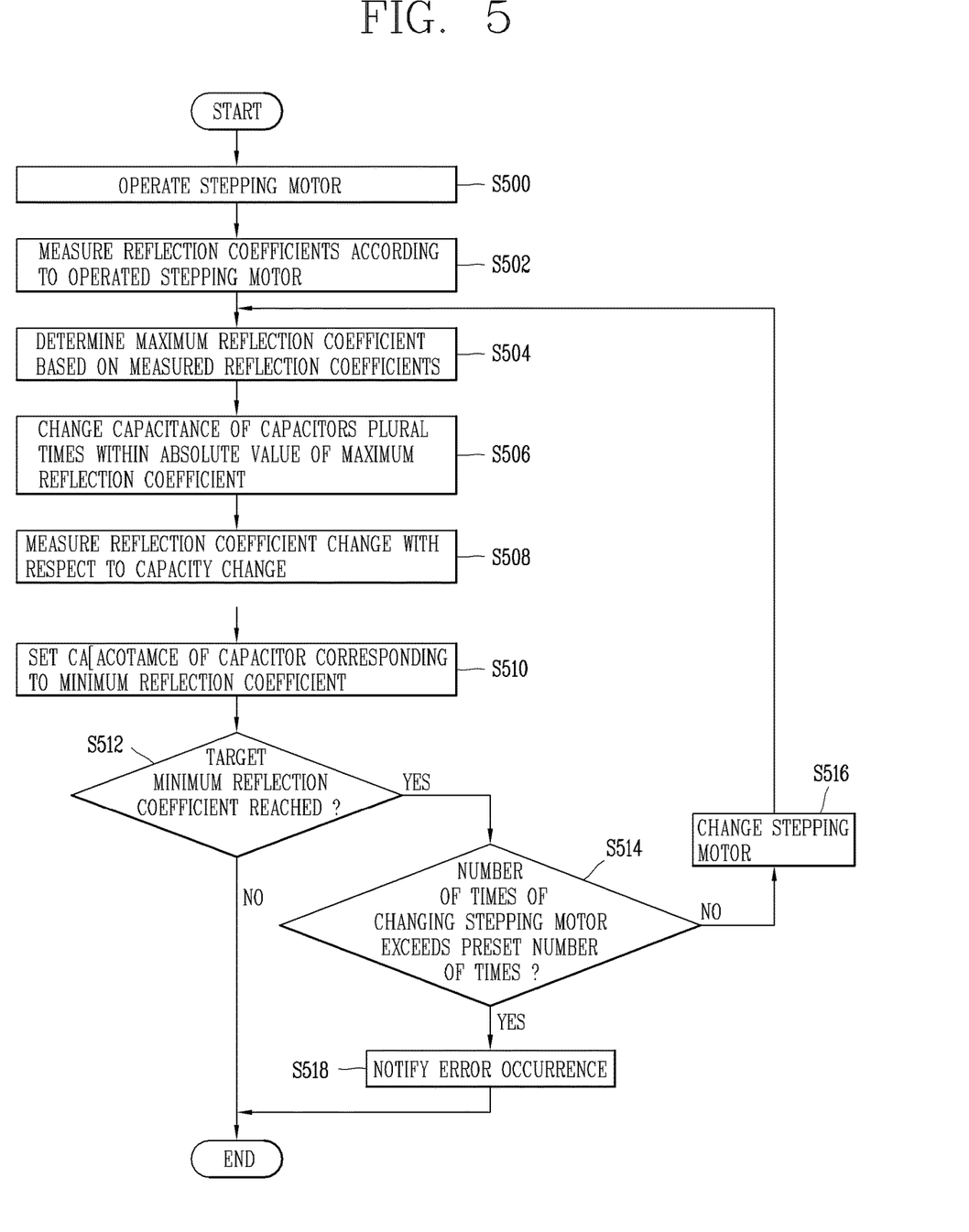
FIG. 5 is a flowchart illustrating an operation of measuring a minimum reflection coefficient of each capacitor and performing matching according to the measured minimum reflection coefficient, in a matching unit in accordance with another embodiment of the present disclosure.
Figure 6:
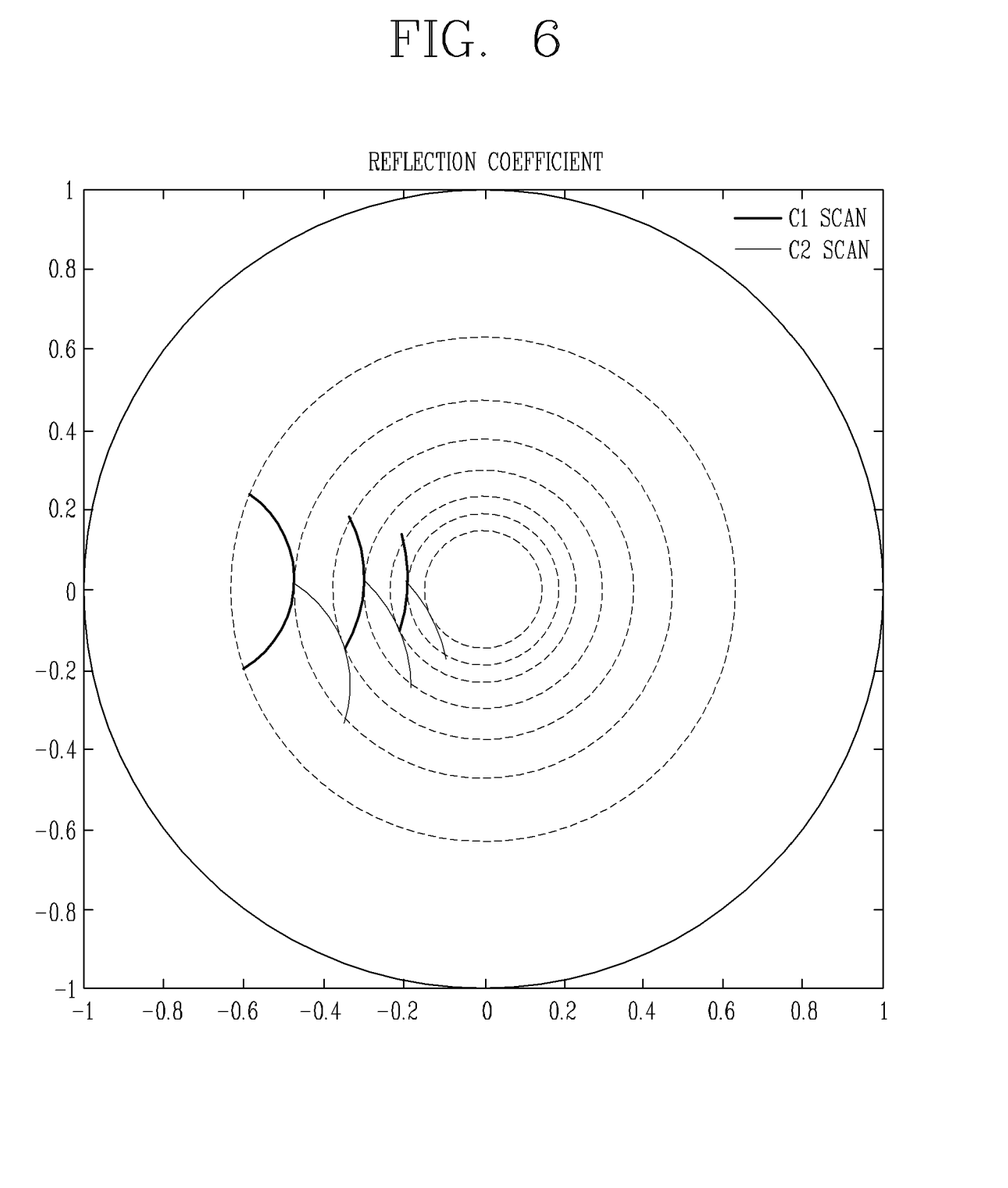
FIG. 6 is a conceptual diagram illustrating an example of a process of detecting a minimum reflection coefficient of each capacitor in accordance with another embodiment of the present disclosure.

FIG. 5 is a flowchart illustrating an operation of measuring a minimum reflection coefficient of each capacitor and performing matching based on the measured reflection coefficient in the matching unit according to the embodiment of the present disclosure. FIG. 6 is a conceptual diagram illustrating an example of a process of searching for (or detecting) a minimum reflection coefficient of each capacitor according to another embodiment of the present disclosure.

First, the controller 202 calculates current reflection power by measuring reflection coefficients according to arbitrary capacitances of the capacitors and determines an absolute value of a maximum reflection coefficient. The absolute value of the maximum reflection coefficient may be arbitrarily determined by a user, but basically a measured reflection coefficient is set to the maximum reflection coefficient.

To this end, the controller 202 may operate a stepping motor using a value arbitrarily determined by a user (S500), and measure a reflection coefficient according to capacitance of a capacitor determined according to the operated stepping motor (S502). The controller 202 may then determine the measured reflection coefficient as a maximum reflection coefficient (S504).

The controller 202 may change the capacitances of the capacitors a plurality of times within an absolute value of the measured maximum reflection coefficient (S506). In addition, the controller 202 may measure the change in the reflection coefficient according to the capacitance change (S508). The controller 202 may detect a minimum reflection coefficient based on a result of the measurement of the change in the reflection coefficient, and detect the capacitance of the capacitors corresponding to the detected minimum reflection coefficient to set the capacitance of each capacitor (S510).

On the other hand, the controller 202 may compare the minimum reflection coefficient detected in step S510 with a reference final reflection coefficient (S512). When the detected minimum reflection coefficient is smaller than the reference final reflection coefficient as a result of the comparison, the controller 202 may determine that the matching has been completed and finish the matching. However, if the minimum reflection coefficient exceeds the reference final reflection coefficient, the controller 202 may change the capacitance of the capacitors by changing the stepping motor. The controller 202 may then proceed to step S504 to set the maximum reflection coefficient again according to the changed capacitance of the capacitors, and repeatedly perform those steps from S506 to S512.

When the minimum reflection coefficient exceeds the reference final reflection coefficient in step S512, the controller 202 may detect whether a number of times of changing the stepping motor exceeds a preset number of times (S514). The controller 202 may change the capacitance of the capacitors by changing the stepping motor only when the number of times of changing the stepping motor does not exceed the preset number of times (S516). The process may go back to step S504 to set the maximum reflection coefficient according to the changed capacitance of the capacitors and those steps from S506 to S512 may be repeatedly performed. In this case, when the number of times of changing the stepping motor exceeds the preset number of times in step S514, the controller 202 may notify an error occurrence (S518), and then terminate the operation.

In this case, unlike the case of operating capacitors with arbitrary gain index in operating the two capacitors, the present disclosure can accurately determine the lowest reflection coefficient position through scan of the capacitors in each step, thereby achieving accurate matching. For the matching method according to the another embodiment (second embodiment) of the present disclosure, more accurate matching can be made although operation speed is slower than that in the matching method according to the first embodiment of the present disclosure. Therefore, such two matching methods according to the first and second embodiments can be carried out complementarily or independently.

On the other hand, the matching apparatus according to the embodiment of the present disclosure can be applied to all of apparatuses of generating low-frequency and high-frequency plasma, of course. In addition, as described above, by measuring the parasitic impedances using the reflection coefficient, the accurate capacitance of the capacitors required for impedance matching can be calculated based on the measured parasitic impedance when the antenna-plasma device is connected. By varying the capacitance of the capacitors according to the calculated capacitance, the impedance matching can be performed preferably by only one matching attempt. Accordingly, such impedance matching can be achieved even in a plasma generator having relatively great load variability and a time spent for the impedance matching can be greatly reduced.

The present disclosure can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. A plasma generator, comprising:
a Radio Frequency (RF) power supply unit configured to supply RF power for plasma generation;
a load device part including a standard load having a predetermined impedance and an antenna-plasma device configured to generate plasma according to the RF power; and
a matching unit configured to connect the RF power supply unit to any one of the antenna-plasma device or the standard load, and match impedances of the RF power supply unit and the antenna-plasma device when the RF power supply unit is connected to the antenna-plasma device,
wherein the matching unit is configured to:
detect a parasitic impedance according to parasitic components inside a circuit by connecting the standard load and the RF power supply unit before connecting the antenna-plasma device and the RF power supply unit;
connect the antenna-plasma device, instead of the standard load and detect a reflection coefficient, when the parasitic impedances are detected;
calculate reactance required for the impedance matching by calculating the antenna-plasma impedance based on the detected parasitic impedance and the detected reflection coefficient;
change capacitance of capacitors provided therein according to the calculated reactance to match the antenna-plasma device with the RF power supply;
perform rematching by changing the capacitance of the matching unit capacitors based on a difference in impedance, when the difference between an impedance detected while the antenna-plasma device is connected to the RF power supply and a preset reference matching impedance is out of a preset range; and
when the number of times the rematching is performed exceeds a preset number of times, determine that a calibration process for detecting the parasitic impedance is necessary and perform the calibration process.

2. The plasma generator of claim 1,
wherein the matching unit is configured to perform the impedance matching according to whether a calibration process for detecting the parasitic impedance is necessary when the RF power supply unit is connected to the antenna-plasma device, or detect the parasitic impedance through the calibration process by connecting the RF power supply unit to the standard load, instead of the antenna-plasma device, and
wherein whether the calibration process is necessary is determined based on whether there is a previously-detected parasitic impedance, whether a system has been initialized, or whether there is a user selection for performing the calibration process.

3. The plasma generator of claim 1, wherein the matching unit detects a reflection coefficient for RF power supplied to the standard load when the standard load is connected to the RF power supply unit, and detects the parasitic impedance based on the detected reflection coefficient and an impedance of the standard load.

4. The plasma generator of claim 3, wherein the matching unit varies the capacitance of the capacitors to detect different reflection coefficients at least two times for the respective capacitance variations, and calculates a reflection coefficient when the standard load is connected to the RF power supply unit based on an average of the detected reflection coefficients.

5. A matching method of a matching unit for matching an impedance of a Radio Frequency (RF) power supply unit and an impedance of an antenna-plasma device generating plasma when the antenna-plasma device is connected to the RF power supply unit, the method comprising:
  connecting the RF power supply unit to a standard load having a preset impedance, instead of the antenna-plasma device, to detect a parasitic impedance according to parasitic components inside a circuit;
  reconnecting the RF power supply unit to the antenna-plasma device when the parasitic impedance is detected;
  measuring a reflection coefficient according to RF power supplied to the antenna-plasma device when the antenna-plasma device is connected;
  calculating a reactance value required for the impedance matching based on the measured reflection coefficient and the detected parasitic impedance; and
  performing the impedance matching by changing capacitance of variable capacitors provided in the matching unit, so as to generate reactance according to the calculated reactance value,
  wherein the performing of the impedance matching comprises:
    detecting a difference between an impedance measured when the RF power supply unit is connected to the antenna-plasma device and a preset reference matching impedance; and
    performing re-matching by changing the capacitance of the variable capacitors based on the detected difference in impedance when the detected difference in impedance is out of a preset range, and
  wherein the performing of the re-matching comprises re-detecting a parasitic impedance by performing the detection of the parasitic impedance again when a number of times of performing the re-matching exceeds a preset number of times.

6. The method of claim 5, further comprising, prior to detecting the parasitic impedance, determining whether it is necessary to detect the parasitic impedance, wherein the detecting of the parasitic impedance and the reconnecting of the antenna-plasma device are performed according to a result of the determination as to whether it is necessary to detect the parasitic impedance.

7. The method of claim 6, wherein the determination as to whether it is necessary to detect the parasitic impedance is made according to whether there is a previously-detected parasitic impedance, whether a system has been initialized, or whether there is a user selection for performing a calibration process.

8. The method of claim 5, wherein the performing of the re-matching comprises:
  re-performing the connection to the antenna-plasma device and the measurement of the reflection coefficient, when the parasitic impedance is re-detected;
  recalculating a reactance value required for the impedance matching based on the re-detected parasitic impedance; and
  re-performing the impedance matching by changing the capacitance of the variable capacitors provided in the matching unit, so as to generate reactance according to the recalculated reactance value.

9. The method of claim 5, wherein the detecting of the parasitic impedance comprises: detecting a reflection coefficient for the standard load corresponding to RF power supplied when the standard load is connected to the RF power supply unit; and detecting the parasitic impedance based on the detected reflection coefficient for the standard load and an impedance of the standard load.

10. The method of claim 9, wherein the detecting of the reflection coefficient for the standard load comprises: changing capacitance of the variable capacitors and detecting different reflection coefficients for the respective variations a plurality of times; and calculating the reflection coefficient for the standard load based on an average of the detected reflection coefficients.

* * * * *